(12) United States Patent
Yong et al.

(10) Patent No.: US 10,856,637 B2
(45) Date of Patent: Dec. 8, 2020

(54) TOUCH DEVICE USABLE FOR HAIRDRESSING APPARATUS

(71) Applicant: Farouk Systems, Inc., Houston, TX (US)

(72) Inventors: Xiao Yong, Shenzhen (CN); Liu Jin, Shenzhen (CN)

(*) Notice: Subject to any disclaimer, the term of this patent is extended or adjusted under 35 U.S.C. 154(b) by 376 days.

(21) Appl. No.: 15/775,242

(22) PCT Filed: Oct. 14, 2016

(86) PCT No.: PCT/US2016/056994
§ 371 (c)(1),
(2) Date: May 10, 2018

(87) PCT Pub. No.: WO2017/087101
PCT Pub. Date: May 26, 2017

(65) Prior Publication Data
US 2018/0332945 A1    Nov. 22, 2018

(30) Foreign Application Priority Data

Nov. 19, 2015   (CN) .......................... 2015 1 0811034
Nov. 19, 2015   (CN) ..................... 2015 2 0930566 U (51) Int. Cl.
*H05K 1/00*   (2006.01)
*A45D 20/12*  (2006.01)
(Continued)

(52) U.S. Cl.
CPC ............... *A45D 20/12* (2013.01); *A45D 1/04* (2013.01); *A45D 1/28* (2013.01); *A45D 2/00* (2013.01); *A45D 2/001* (2013.01); *G06F 3/041* (2013.01); *H05K 1/028* (2013.01); *H05K 1/147* (2013.01); *H05K 1/18* (2013.01); *H05K 3/30* (2013.01); *H05K 3/368* (2013.01); *H05B 45/00* (2020.01);
(Continued)

(58) Field of Classification Search
USPC ........................................................ 361/749
See application file for complete search history.

(56) References Cited

U.S. PATENT DOCUMENTS 6,393,718 B1    5/2002  Harris et al.
2005/0204576 A1   9/2005  Cohen
(Continued)

OTHER PUBLICATIONS

PCT Search Report received in co-pending PCT Application No. PCT/US2016/056994, dated Jan. 25, 2017, 13 pages.

*Primary Examiner* — Andargie M Aychillhum
(74) *Attorney, Agent, or Firm* — Blank Rome LLP (57) ABSTRACT

A touch device usable for a hair dressing apparatus is disclosed. The touch device includes a touch sensing shell, an FPC (Flexible Printed Circuit) board and a PCB (Printed Circuit Board), wherein the touch sensing shell is mounted on the surface of the hairdressing apparatus. The FPC board is attached to the touch sensing shell and mounted between the touch sensing shell and the hairdressing apparatus. The PCB is connected with the FPC circuit board by use of a lead and mounted inside the hairdressing apparatus. The touch sensing shell is capable of sensing actions provided by the fingers of a user and preventing the FPC board from having direct contact with the user, A touch sensing region and a functional control unit are arranged on the FPC board and connected with a central processing unit.

14 Claims, 6 Drawing Sheets

(51) Int. Cl.
*A45D 1/04* (2006.01)
*A45D 1/28* (2006.01)
*A45D 2/00* (2006.01)
*H05K 1/14* (2006.01)
*G06F 3/041* (2006.01)
*H05K 1/02* (2006.01)
*H05K 1/18* (2006.01)
*H05K 3/30* (2006.01)
*H05K 3/36* (2006.01)
*H05B 45/00* (2020.01)

(52) U.S. Cl.
CPC ....... *H05K 1/189* (2013.01); *H05K 2201/056* (2013.01); *H05K 2201/10022* (2013.01); *H05K 2201/10106* (2013.01); *H05K 2201/10113* (2013.01); *H05K 2201/10151* (2013.01)

(56) References Cited

U.S. PATENT DOCUMENTS

| | | | |
|---|---|---|---|
| 2008/0276479 A1 | 11/2008 | Byun et al. | |
| 2013/0291394 A1 | 11/2013 | Shami et al. | |
| 2014/0144037 A1 | 5/2014 | Hadden | |
| 2015/0189980 A1* | 7/2015 | Hwang | A46B 13/008 15/28 |
| 2015/0313340 A1 | 11/2015 | Hu | |
| 2016/0091196 A1* | 3/2016 | Chien | F21V 33/0004 362/253 |

* cited by examiner

TOUCH DEVICE USABLE FOR HAIRDRESSING APPARATUS

This application is a national stage of International Patent Application No. PCT/US2016/056994, filed Oct. 14, 2016 which claims benefit to Chinese Patent Application No. 201520930566.4 filed Nov. 19, 2015 and Chinese Patent Application No. 201510811034.3 filed Nov. 19, 2015, the contents of which are hereby incorporated by reference in their entirety.

TECHNICAL FIELD

One or more embodiments of the present invention relates to the field of hairdressing apparatuses. More particularly, one or more embodiments presented herein relates to a touch device usable for a hairdressing apparatus.

BACKGROUND

Hairdressing apparatuses are used by a broad group of people, which may range from individual consumers for personal use to hair styling professionals for professional use. Hairdressing apparatuses may include many types of devices, including without limitation, hair dryers and various hair dryer attachments, hair straightening irons, curling irons, as well as any other devices or apparatuses useful for hair styling or hair dressing. The traditional hairdressing apparatus typically includes a number of switches for its operation, including mechanical switches that are used to control the operation of the hairdressing apparatus.

SUMMARY

In one aspect, embodiments of the present disclosure relate to a hairdressing apparatus having a control unit that includes a printed circuit board, a flexible printed circuit board mounted to the printed circuit board, and a touch sensing shell mounted on the flexible printed circuit board, where the flexible printed circuit board is disposed between the touch sensing shell and the printed circuit board.

In another aspect, embodiments of the present disclosure relate to methods of making a hairdressing apparatus that include providing a printed circuit board, providing a flexible printed circuit board mounted to the printed circuit board, and providing a touch sensing shell mounted to an outer surface of the hairdressing apparatus, wherein the flexible printed circuit board is disposed between the touch sensing shell and the printed circuit board.

Other aspects and advantages of the invention will be apparent from the following description and the appended claims.

DETAILED DESCRIPTION

In order to enable those skilled in the art to better understand the technical solution of one or more embodiments of the present invention, the description is provided below in combination with the accompanying drawings. In the embodiments presented in this description, numerous specific details are set forth in order to provide a more thorough understanding of the present invention. However, it will be apparent to one of ordinary skill in the art that the present invention may be practiced without these specific details. In other instances, well-known features have not been described in detail to avoid obscuring the present invention.

According to embodiments of the present disclosure, a touch device usable for a hairdressing apparatus may include a touch sensing shell, a FPC (Flexible Printed Circuit) board and a PCB (Printed Circuit Board), wherein the touch sensing shell may be mounted on the outer surface of the hairdressing apparatus. The FPC board may be attached to the touch sensing shell and may be mounted between the touch sensing shell and the hairdressing apparatus. The PCB may be connected with the FPC board by use of a lead and may be positioned inside the hairdressing apparatus. In one or more embodiments, the touch sensing shell may have a thickness within the range of 0.02 inches to 0.20 inches (about 0.5 mm to 5 mm).

The PCB may include a power circuit unit and an on-off control unit. The power circuit unit may be used for providing reliable and stable power for the touch device. The on-off control unit may be used for turning on/turning off the touch device. In one or more embodiments, the on-off control unit includes an on-off control circuit.

A power circuit unit may include a power circuit, and the power circuit may include a power management chip. In one or more embodiments, the power circuit may further include one or more capacitors, resistors, diodes, triodes, fuses, and/or inductors arranged in the power circuit with the power management chip. In one or more embodiments, the power management chip may be an MP150GJ chip.

The FPC board may include a central processing unit, a touch sensing region and a functional control unit, wherein the touch sensing region and the functional control unit are connected with the central processing unit, respectively. The touch sensing region may be used for sensing the touch actions of a user on the touch sensing shell. The functional control unit may be used for performing corresponding functions according to instructions emitted by the central processing unit. In one or more embodiments, the central processing unit may use a BS66F340-28 chip.

In one or more embodiments, at least one touch sensing region may be provided with a hair dressing apparatus, for example, by providing a FPC board having at least one touch sensing region along the hair dressing apparatus.

A functional control unit may include one or more functional control circuits, whereby the functional control circuit may include a first current-limiting resistor, a first indicating LED lamp, a second indicating LED lamp and a third indicating LED lamp. One end of the first current-limiting resistor may be connected with the positive poles of the first indicating LED lamp, the second indicating LED lamp and the third indicating LED lamp, while the other end of the first current-limiting resistor may be connected to the central processing unit. The negative poles of the first indicating LED lamp, the second indicating LED lamp and the third indicating LED lamp may be connected to the central processing unit respectively.

If the functional control unit includes a plurality of functional control circuits, the first current-limiting resistors of all the functional control circuits may be connected with the central processing unit, respectively; the negative poles of the first indicating LED lamps of all the functional control circuits may be connected together and then connected with the central processing unit; the negative poles of the second indicating LED lamps of all the functional control circuits may be connected together and then connected with the central processing unit; and the negative poles of the third indicating LED lamps of all the functional control circuits may be connected together and then connected with the central processing unit.

In accordance with one or more embodiments of the present disclosure, a FPC board of a hair dressing apparatus may be attached to a touch sensing shell, and therefore, a user may operate the touch sensing shell to operate the hair dressing apparatus. The touch sensing shell may be capable of isolating a touch sensing region on the FPC board from the one or more fingers of the user, thus preventing the user from directly contacting the FPC board. In accordance with one or more embodiments, the touch sensing region and the functional control unit are arranged on the FPC board and connected with the central processing unit. The functional control unit responds with different functions to different touch actions performed on the touch sensing region, and thereby intelligent control of a hair dressing apparatus may be realized.

Embodiments of the present disclosure are further described below with reference to the figures. Wherever possible, like or identical reference numerals are used in the figures to identify common or the same elements. The figures are not necessarily to scale and certain features and certain views of the figures may be shown exaggerated in scale for purposes of clarification.

Figure 1:
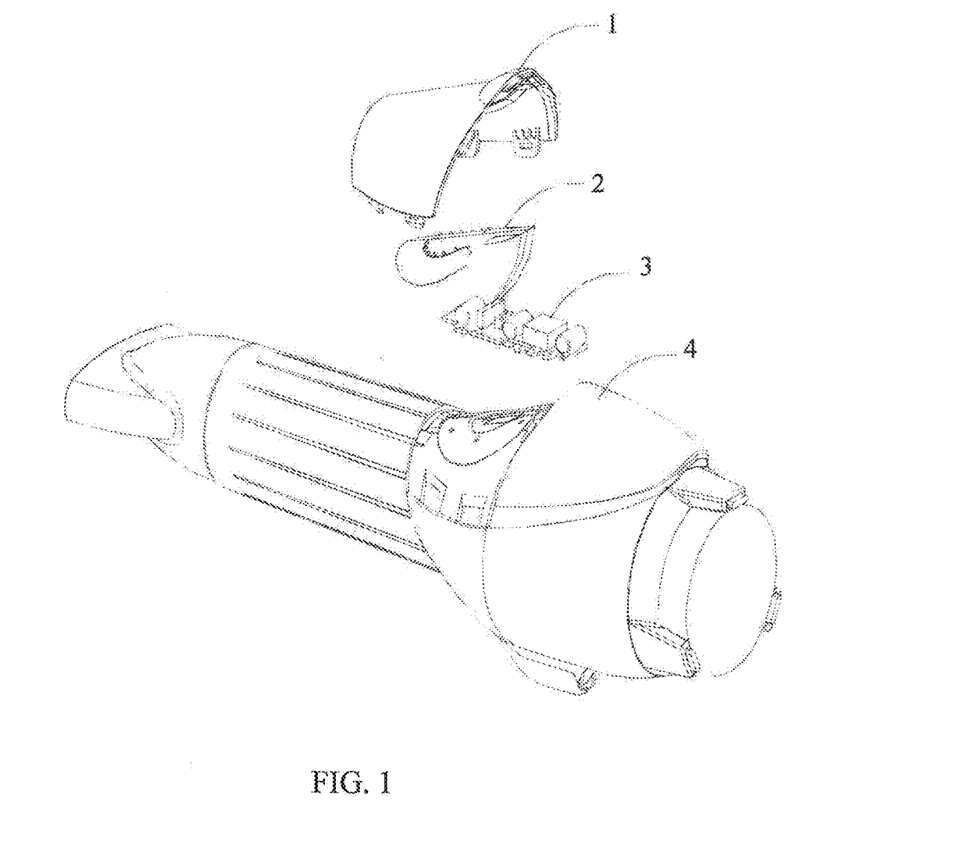
FIG. 1 is a structural schematic diagram of a touch device usable for a hairdressing apparatus according to one or more embodiments disclosed herein.

As shown in FIG. 1, in accordance with one or more embodiments of the present invention, a touch device usable with a hairdressing apparatus is provided. The touch device may include a touch sensing shell 1, an FPC (Flexible Printed Circuit) board 2 and a PCB (Printed Circuit Board) 3. The touch sensing shell 1 may be mounted on the outer surface of the hairdressing apparatus 4. The FPC board 2 may be attached to the touch sensing shell 1 and mounted between the touch sensing shell 1 and the hairdressing apparatus 4; the PCB 3 may be connected with the FPC board 2 by use of a lead and mounted inside the hairdressing apparatus 4.

Touch sensing shell 1 may be disposed on any surface of hairdressing apparatus 4. In one or more embodiments, the touch sensing shell 1 may be provided on an upper barrel of a hairdressing apparatus 4. In other embodiments, touch sensing shell may be disposed on a handle of hairdressing apparatus 4.

Figure 2:
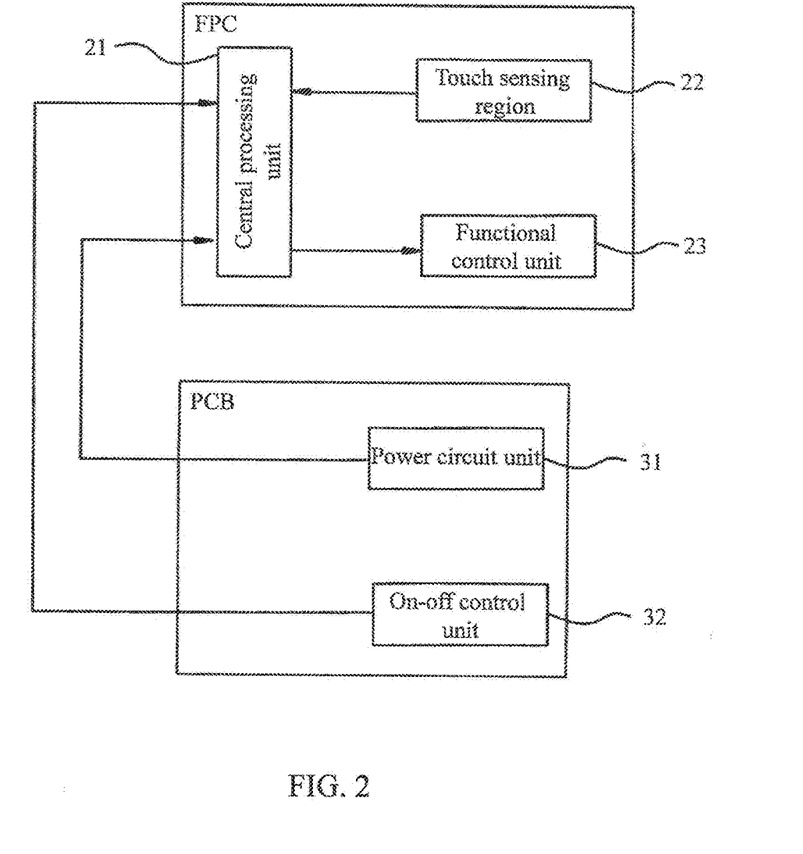
FIG. 2 is a schematic diagram of the working principle of a touch device usable for a hairdressing apparatus according to one or more embodiments disclosed herein.

As shown in FIG. 2, in one embodiment of the present invention, the FPC board 2 may include a central processing unit 21, a touch sensing region 22 and a functional control unit 23, wherein the touch sensing region 22 and the functional control unit 23 may be connected with the central processing unit 21, respectively. The touch sensing region 22 may be used for sensing the touch actions of a user on the touch sensing shell 1. The functional control unit 23 may be used for performing corresponding functions according to instructions emitted by the central processing unit 21. The PCB 3 may include a power circuit unit 31 and an on-off control unit 32. The power circuit unit 31 may be used for providing reliable and stable power for the touch device. The on-off control unit 32 may be used for turning on/turning off the touch device.

Figure 3:
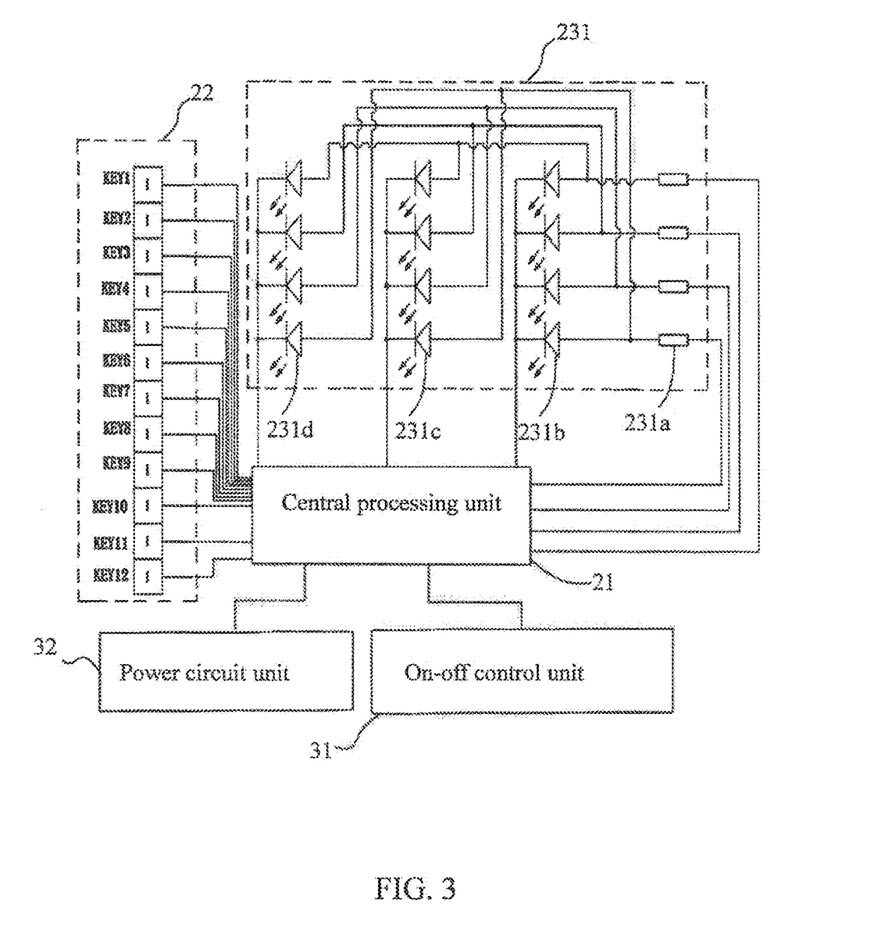
FIG. 3 is a schematic diagram of a functional control circuit according to one or more embodiments disclosed herein.

As shown in FIG. 3, in one embodiment of the present invention, at least one touch sensing region 22 may be provided in the FPC board 2. In some embodiments, the central processing unit 21 may be included in a microcontroller, where the microcontroller may be in communication with the touch sensing region(s) 22 and functional control unit 23. In some embodiments, the microcontroller may be a 28 pin BS66F340 chip, where the BS66F340-28 chip includes the central processing unit 21 and an LED driver, and where pins on the BS66F340-28 chip functioning for the LED driver may be connected to a light emitting interface that will output to a screen (e.g., via the functional control unit 23). Each touch sensing region 22 may be connected with the corresponding pin of the BS66F340-28 chip respectively. For example, as shown in FIG. 3, the touch sensing region KEY1 may be connected to the sixth pin of the BS66F340-28 chip and the touch sensing region KEY2 may be connected to the fifth pin of the BS66F340-28 chip.

The functional control unit 23 may include one or more functional control circuits 231; the functional control circuit 231 includes a first current-limiting resistor 231a, a first indicating LED lamp 231b, a second indicating LED lamp 231c and a third indicating LED lamp 231d. In the embodiment shown in FIG. 3, one end of the first current-limiting resistor 231a is connected with the positive poles of the first indicating LED lamp 231b, the second indicating LED lamp 231c and the third indicating LED lamp 231d, while the other end of the first current-limiting resistor 231a is connected with the central processing unit 21. The negative poles of the first indicating LED lamp 231b, the second indicating LED lamp 231c and the third indicating LED lamp 231d are connected with the central processing unit 21. If the functional control unit 23 includes a plurality of functional control circuits 231, the first current-limiting resistors 231a of all the functional control circuits 231 are connected with the central processing unit 21, respectively; the negative poles of the first indicating LED lamps 231b of all the functional control circuits 231 are connected together and then connected with the central processing unit 21; the negative poles of the second indicating LED lamps 231c of all the functional control circuits 231 are connected together and then connected with the central processing unit 21; and the negative poles of the third indicating LED lamps 231d of all the functional control circuits 231 are connected together and then connected with the central processing unit 21.

In embodiments where the functional control unit 23 is connected to a BS66F340-28 microcontroller chip and includes more than one functional control circuit 231, one end of the first current-limiting resistor 231a may be connected with the positive poles of the first indicating LED lamp 231b, the second indicating LED lamp 231c and the third indicating LED lamp 231d, respectively, while the other end of the first current-limiting resistor 231a may be connected with the tenth pin of the BS66F340-28 chip; and the negative poles of the first indicating LED lamp 231b, the second indicating LED lamp 231c and the third indicating LED lamp 231d may be connected with the fourteenth pin, the thirteenth pin and the eleventh pin of the BS66F340-28 chip, respectively. When the functional control unit 23 includes four functional control circuits 231, one end of the first current-limiting resistor 231a of each circuit may be connected with the positive poles of the first indicating LED lamp 231b, the second indicating LED lamp 231c and the third indicating LED lamp 231d, respectively, and the other end of the first current-limiting resistor 231a may be connected with the tenth pin, the eighth pin, the seventh pin and the second pin of the BS66F340-28 chip, respectively; the negative poles of the first indicating LED lamps 231b of all the circuits may be connected and then connected with the fourteenth pin of the BS66F340-28 chip; the negative poles of the second indicating LED lamps 231c of all the functional control circuits 231 may be connected and then connected with the thirteenth pin of the BS66F340-28 chip; and the negative poles of the third indicating LED lamps 231d of all the functional control circuits 231 may be connected and then connected with the eleventh pin of the BS66F340-28 chip.

When the touch sensing region senses a touch action performed by a user (the touch actions include sliding, clicking and the like), the central processing unit identifies and responds to the action and then sends a responding instruction to the functional control circuit 231, and the functional control circuit 231 replies to the responding instruction. The result of the reply from the functional control circuit 231 includes a relevant responding instruction driving the corresponding indicating LED lamp of the functional control circuit 231 to emit light. Different LED lamps indicate that different functions of the hairdressing apparatus are being performed. For instance, when the first functional control circuit 231 enables the first indicating LED lamp 231b, the second indicating LED lamp 231c and the third indicating LED lamp 231d of the circuit all to emit light as responding to the instruction sent by the central processing unit, it may indicate the first gear of hot air and the first gear of slow air on the hair dressing apparatus.

Figure 4:
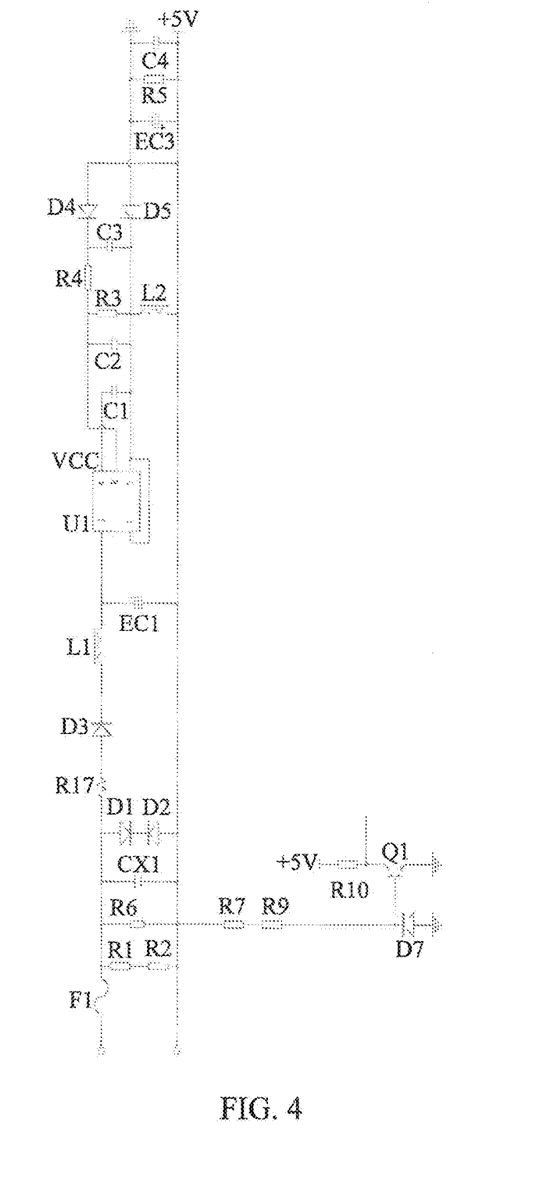
FIG. 4 is a schematic diagram of a power circuit according to one or more embodiments disclosed herein.

As shown in FIG. 4, the power circuit unit 31 in an embodiment of the present disclosure includes a power circuit. The power circuit includes a power management chip U1; the first pin and the fifth pin of the power management chip U1 are connected with each other; the second pin of the power management chip U1 is connected with one end of a capacitor C2, one end of a resistor R3 and one end of a resistor R4 in sequence; the other end of the resistor R4 is connected with one end of a capacitor C3 and the negative pole of a diode D4 respectively; the fourth pin of the power management chip U1 is connected with one end of a capacitor C1; the other end of the capacitor C1 is connected with the other ends of the capacitor C2, the resistor R3 and the capacitor C3, one end of a coil L2 and the negative pole of a diode D5, respectively; the other end of the capacitor C1 is further connected with the first pin and the fifth pin of the power management chip U1, respectively; the positive pole of the diode D5 is connected with one end of an electrolytic capacitor EC3, one end of a resistor R5 and one end of a capacitor C4, and grounded; the other end of the coil L2 is further connected with the positive pole of the diode D4, the other end of the electrolytic capacitor EC3, the other end of the resistor R5 and the other end of the capacitor C4; the other end of the coil L2 is further connected with the negative pole of an electrolytic capacitor EC1, the positive pole of a diode D2, the negative pole of a polar capacitor CX1, one end of a voltage dependent resistor R6, one end of a resistor R2 and one end of a resistor R7 in sequence; the third pin of the power management chip U1 is connected with the positive pole of the electrolytic capacitor EC1 and one end of a coil L1 respectively; the other end of the coil L1 is connected with the negative pole of a diode D3; the positive pole of the diode D3 is connected with one end of a resistor R17; the other end of the resistor R17 is connected with the positive pole of a diode D1, the positive pole of a polar capacitor CX1, the other end of the voltage dependent resistor R6, one end of a resistor R1 and one end of a fuse F1; the negative pole of the diode D1 is connected with the negative pole of the diode D2; the other end of the resistor R1 is connected with the other end of the resistor R2; the other end of the fuse F1 and one end of the resistor R2 serve as power input ends; the other end of the resistor R7 is connected with one end of a resistor R9; the other end of the resistor R9 is connected with the negative pole of a diode D7 and the base of a triode Q1, respectively; the positive pole of the diode D7 is grounded; the collector of the triode Q1 is connected in series with a resistor R10; the collector of the triode Q1 serves as the power output end of the power circuit and are connected with the central processing unit 21; and the emitter of the triode Q1 is grounded. Specifically, in practical implementation, the input end of the power source is connected with an external power source, and the current of the external power source is rectified into high-voltage direct current via the diode D2, the coil L1 and the electromagnetic capacitor EC1, and then the high-voltage direct current is stepped down by the power management chip U1 to provide low-voltage direct current for the touch device.

Figure 5:
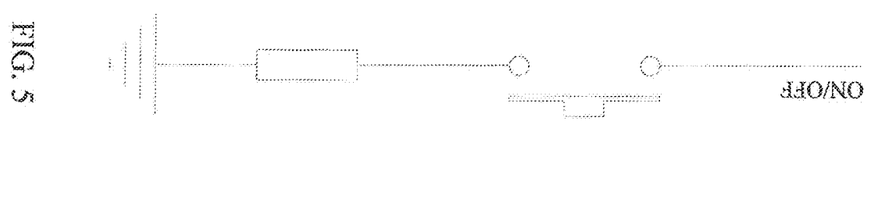
FIG. 5 is a schematic diagram of an on-off control circuit according to one or more embodiments disclosed herein.
Figure 6:
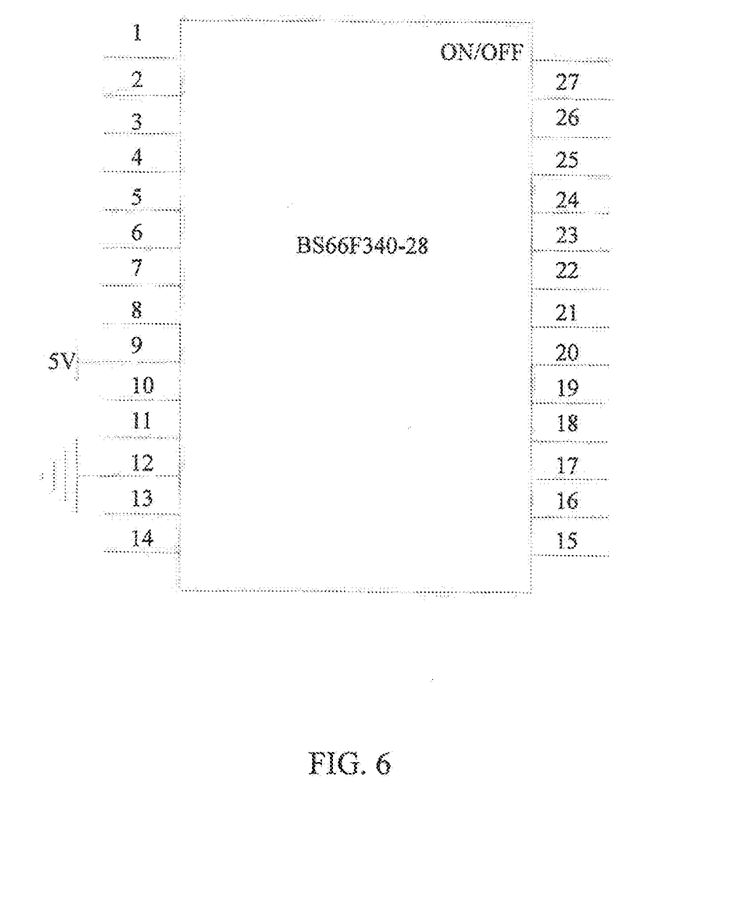
FIG. 6 is a schematic diagram of a circuit of a BS66F340-28 chip according to one or more embodiments disclosed herein.

As shown in FIG. 5 and FIG. 6, the diagram of the on-off control circuit and the schematic diagram of the circuit of the BS66F340-28 chip of the central processing unit are displayed. The on-off control circuit is connected with the central processing unit via the ON/OFF end, and in embodiments where the central processing unit is contained in a BS66F340-28 chip, the on-off control circuit may be connected with the ON/OFF pin of the BS66F340-28 chip. In order to ensure that the FPC board is capable of sensing the operation actions of the user when the user performs the touch operations on the touch sensing region, the touch sensing shell may be 0.5 mm-5 mm 0.02 in to 0.2 in) in thickness, including sub-range's provided therein. For example, a touch sensing shell may have a thickness ranging from 0.7 mm to 4 mm, 0.9 mm to 3 mm, or 1 to 2 mm. As long as the touch sensing shell is within the thickness range, the touch sensing region of the FPC circuit board may be capable of sensing the operation actions of the user without obstacles.

Unlike existing hair dressing apparatuses, the one or more embodiments presented herein may provide intelligent control of hair dressing apparatuses. Different functions may be performed on the hair dressing apparatus in response to different touch actions performed on the touch sensing region, and thereby intelligent control is realized. Accordingly, the one or more embodiments presented herein may provide much needed alternatives to the mechanical switches and selectors found on conventional hair dressing apparatuses. The one or more embodiments of the present invention may provide a user with greater control of a hair dressing apparatus, and ultimately may provide the user with better overall hair styling results while using a hair dressing apparatus. Further, one or more embodiments disclosed in the present disclosure may overcome the difficulty in providing a touch sensing region on a hair dressing apparatus, which has limited space availability for incorporating such a touch sensing region.

While the present disclosure has been described with respect to a limited number of embodiments, those skilled in the art, having benefit of this disclosure, will appreciate that other embodiments may be devised which do not depart from the scope of the disclosure as described herein. Accordingly, the scope of the disclosure should be limited only by the attached claims.

What is claimed is:

1. A hairdressing apparatus, comprising:
   a printed circuit board;
   a flexible printed circuit board mounted to the printed circuit board, the flexible printed circuit board comprising:
      a microcontroller;
      at least one touch sensing region connected to the microcontroller;
      a functional control unit connected to the microcontroller, the functional control unit comprising at least one functional control circuit, the at least one functional control circuit comprising:
         a first indicating LED lamp;
         a second indicating LED lamp;
         a third indicating LED lamp; and
         a first current-limiting resistor comprising:
            a first end connected with positive poles of the first indicating LED lamp, the second indicating LED lamp and the third indicating LED lamp; and
            a second end connected with the central processing unit; and
         wherein negative poles of the first indicating LED lamp, the second indicating LED lamp and the third indicating LED lamp are connected with the central processing unit; and
   a touch sensing shell mounted on the flexible printed circuit board, where the flexible printed circuit board is disposed between the touch sensing shell and the printed circuit board.

2. The hairdressing apparatus of claim 1, wherein the touch sensing shell is mounted to an outer surface of the hairdressing apparatus.

3. The hairdressing apparatus of claim 2, wherein the touch sensing shell has a thickness ranging between 0.02 inches to 0.2 inches.

4. The hairdressing apparatus of claim 1, wherein the at least one touch sensing region is adapted to sense touch actions of a user.

5. The hairdressing apparatus of claim 1, wherein the flexible printed circuit board further comprises a central processing unit and a functional control unit, the central processing unit connected to the functional control unit and the at least one touch sensing region, wherein the functional control unit is configured to perform corresponding functions according to instructions provided by the central processing unit.

6. The hairdressing apparatus of claim 1, wherein the microcontroller is a BS66F340-28 chip.

7. The hairdressing apparatus of claim 6, wherein the functional control unit comprises one or more functional control circuits.

8. The hairdressing apparatus of claim 1, wherein the functional control unit comprises multiple functional control circuits, each functional control circuit comprising:
   a first indicating LED lamp;
   a second indicating LED lamp;
   a third indicating LED lamp; and
   a first current-limiting resistor;
   wherein the first current-limiting resistors of all the functional control circuits are connected with the central processing unit, respectively;
   wherein negative poles of the first indicating LED lamps of all the functional control circuits are connected together and then connected with the central processing unit;
   wherein negative poles of the second indicating LED lamps of all the functional control circuits are connected together and then connected with the central processing unit; and
   wherein the negative poles of the third indicating LED lamps of all the functional control circuits are connected together and then connected with the central processing unit.

9. The hairdressing apparatus of claim 1, wherein the printed circuit board is connected with the flexible printed circuit board by use of a lead and mounted inside the hairdressing apparatus.

10. The hairdressing apparatus of claim 1, wherein the printed circuit board comprises a power circuit unit and an on-off control unit.

11. The hairdressing apparatus of claim 10, wherein the on-off control unit comprises an on-off control circuit.

12. The hairdressing apparatus of claim 1, wherein the touch sensing shell has a thickness ranging between 0.02 inches to 0.2 inches.

13. A method of making a hairdressing apparatus, comprising:
   providing a printed circuit board;
   providing a power control unit and an on-off unit with the printed circuit board;
   providing a flexible printed circuit board with a central processing unit;
   mounting the flexible printed circuit board to the printed circuit board;
   mounting a touch sensing shell to an outer surface of the hairdressing apparatus, wherein the flexible printed circuit board is disposed between the touch sensing shell and the printed circuit board.

14. The method of claim 13, further comprising providing at least one touch sensing region on the flexible printed circuit board.

* * * * *